United States Patent
Su et al.

(10) Patent No.: US 12,273,102 B2
(45) Date of Patent: Apr. 8, 2025

(54) SYSTEM FOR TURNING OFF POWER CONSUMPTION OF AUXILIARY STARTUP CIRCUIT

(71) Applicant: Shanghai Huali Microelectronics Corporation, Shanghai (CN)

(72) Inventors: Xiaofeng Su, Shanghai (CN); Yifei Qian, Shanghai (CN); Zhili Wang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 18/368,775

(22) Filed: Sep. 15, 2023

(65) Prior Publication Data
US 2025/0080106 A1 Mar. 6, 2025

(30) Foreign Application Priority Data
Aug. 30, 2023 (CN) .......................... 202311110823.5

(51) Int. Cl.
*H03K 17/22* (2006.01)
(52) U.S. Cl.
CPC ... *H03K 17/223* (2013.01); *H03K 2217/0036* (2013.01)

(58) Field of Classification Search
None
See application file for complete search history.

(56) References Cited

U.S. PATENT DOCUMENTS

| | | | |
|---|---|---|---|
| 9,270,265 B2 * | 2/2016 | Nakamoto | H03K 17/223 |
| 9,407,254 B1 * | 8/2016 | De | G06F 1/24 |
| 9,436,205 B2 * | 9/2016 | De Cremoux | H03K 3/0231 |
| 10,522,196 B2 * | 12/2019 | Yang | G11C 7/14 |
| 11,218,152 B2 * | 1/2022 | Ding | H02M 3/07 |

* cited by examiner

*Primary Examiner* — Jeffrey S Zweizig
(74) *Attorney, Agent, or Firm* — Banner & Witcoff, Ltd.

(57) ABSTRACT

This application discloses a system for turning off power consumption of an auxiliary startup circuit. An oscillator generates a switch control signal based on a reference current output by a circuit to be started up to generate a working clock of a switch control signal generation circuit after the circuit to be started up works normally. After fixed clock signal counting, the switch control signal generation circuit outputs a switch control signal to control power consumption of normally open current of the auxiliary startup circuit to be turned off. At the same time, the switch control signal generation circuit stops counting the clock. This application can assist the circuit to be started up having a "degeneracy" bias point to power on normally, and can also turn off the power consumption of the auxiliary startup circuit after the circuit to be started up is powered on.

6 Claims, 4 Drawing Sheets

SYSTEM FOR TURNING OFF POWER CONSUMPTION OF AUXILIARY STARTUP CIRCUIT

CROSS-REFERENCE TO RELATED APPLICATIONS

This application claims the priority to Chinese Patent Application No. 202311110823.5, filed on Aug. 30, 2023, the disclosure of which is incorporated herein by reference in its entirety.

TECHNICAL FIELD

This application relates to an integrated circuit design technology, in particular to a system for turning off power consumption of an auxiliary startup circuit.

BACKGROUND

With the rapid development of portable devices, higher requirements are also put forward for the power consumption of circuits. Under the same battery condition, low-power-consumption chips can work longer and have more advantages in the same product.

Due to the existence of "degeneracy" bias points (there are at least two balanced working points in a circuit; one is a zero point, that is, the current of each branch of the core module is zero, and the circuit is turned off and can maintain the off state indefinitely; the other is a normal working point) in bias current reference circuits (BIAS), bandgap reference circuits (BGR) and other circuits, it will cause the circuit to not work after power is on, which is called a circuit startup problem. This requires an auxiliary startup circuit to assist the circuit in getting rid of the bias point in the power-on process, in order to achieve the effect that the circuit having a "degenerate" bias point can work normally after power is on. Since the auxiliary startup circuit only functions in the power-on process of the circuit to be started up, it is hoped that the power consumption of the auxiliary startup circuit is as small as possible or zero.

An existing resistive auxiliary startup circuit is as illustrated in FIG. 1. A bias reference circuit (BIAS) is composed of a second PMOS transistor PM2, a third PMOS transistor PM3, a fourth PMOS transistor PM4, a zeroth NMOS transistor NM0, a first NMOS transistor NM1, and a first resistor R1. Its function is to provide a reference current IREF to other circuit modules. The zeroth PMOS transistor PM0, the first PMOS transistor PM1, and the second resistor R2 form an auxiliary startup circuit. The zeroth PMOS transistor PM0 is a current mirror transistor, and a mirror current is provided by the bias reference circuit (BIAS). The first PMOS transistor PM1 is a switch transistor. In the power-on process of a working voltage VDD, the potential at a VN point is low, the first PMOS transistor PM1 is conducted, the voltage at a VM point is pulled up, and the bias reference circuit (BIAS) starts normally. After startup, the current of the bias reference circuit (BIAS) mirrored by the zeroth PMOS transistor PM0 flows through the second resistor R2, raising the potential at the VN point. At this time, the first PMOS transistor PM1 is off, and the work of the auxiliary startup circuit is completed.

After the startup of the bias reference circuit (BIAS) is completed, the zeroth PMOS transistor PM0 maintains conducted, and the current I1 flows through the second resistor R2 to maintain a high potential at the VN point to turn off the first PMOS transistor PM1. Since the potential at the VN point is obtained through resistive voltage division, the voltage at the VN point is lower than the working voltage VDD. Under certain conditions, if the voltage at the VN point is too much lower than the working voltage VDD, it may cause the first PMOS transistor PM1 to be turned on mistakenly, which may affect the bias reference circuit (BIAS). In the non-low-power-consumption circuit design, the existence of the current I1 can be tolerated, but under low-power-consumption design requirements, it is hoped to minimize the current I1 or achieve zero power consumption. Usually, increasing the second resistor R2 is adopted to reduce the current I1. In high-voltage (greater than 3V, such as 5V) processes, the resistance of the second resistor R2 needs to become very large.

Aiming at the power consumption problem of the existing resistive auxiliary startup circuit and the problem that the voltage at the VN point is too much lower than the working voltage VDD, an existing capacitive auxiliary startup circuit is as illustrated in FIG. 2. This circuit replaces the second resistor R2 in the existing resistive auxiliary startup circuit with a first capacitor C1. The voltage of the upper and lower electrode plates of the first capacitor C1 cannot change in the power-on process, and the voltage at the VN point is maintained low in the power-on process. After power is on, the zeroth PMOS transistor PM0 is turned on, the voltage at the VN point is maintained at a high potential and the first PMOS transistor PM1 is turned off. After power is on, the current I1 is extremely small and close to zero. The capacitive auxiliary startup circuit performs well when the power is on quickly, but in a case that the power is on slowly, the startup of the circuit may fail since the voltage at the VN point cannot be maintained at a low potential very well.

BRIEF SUMMARY

The technical problem to be solved by this application is to provide a system for turning off power consumption of an auxiliary startup circuit, which can assist a circuit to be started up having a "degenerate" bias point to power on normally, and can turn off the power consumption of the auxiliary startup circuit after the circuit to be started up is powered on to reduce the power consumption.

In order to solve the technical problem, this application provides a system for turning off power consumption of an auxiliary startup circuit, the auxiliary startup circuit including a zeroth PMOS transistor PM0, a first PMOS transistor PM1, a second resistor R2, and a second switch transistor M2;

source ends of the zeroth PMOS transistor PM0 and the first PMOS transistor PM1 being connected to a working voltage VDD;

the source end of the zeroth PMOS transistor PM0 being used as a VN point;

the second resistor R2 being connected in series between the VN point and the ground;

a gate end of the first PMOS transistor PM1 being connected to the VN point, a drain end being connected to an auxiliary startup end of a circuit to be started up;

a gate end of the zeroth PMOS transistor PM0 being connected to a voltage sampling point VR of the circuit to be started up;

when power is on and a voltage applied to the auxiliary startup end is 0.7-1 times the working voltage VDD, the circuit to be started up being capable of working normally, a voltage at the voltage sampling point being 0.7-1 times the working voltage VDD;

a gate end of the second switch transistor M2 being connected to a switch control signal SLEEP;

one of a source end and a drain end of the second switch transistor M2 being connected to one end of the second resistor R2, the other being connected to the ground, the other end of the second resistor R2 being connected to the VN point; or one of the source end and the drain end of the second switch transistor M2 being connected to one end of the second resistor R2, the other being connected to the VN point, the other end of the second resistor R2 being connected to the ground.

Exemplarily, the circuit to be started up is a circuit having a "degenerate" bias point and capable of outputting a reference current IREF.

Exemplarily, the circuit to be started up is a bias reference circuit or a bandgap reference circuit.

Exemplarily, the auxiliary startup circuit further includes a switch control signal generation circuit;

the switch control signal generation circuit outputs the switch control signal SLEEP when the circuit to be started up works normally.

Exemplarily, the auxiliary startup circuit further includes an oscillator;

the oscillator generates a working clock CLKOUT of the switch control signal generation circuit based on the reference current IREF output by the circuit to be started up.

Exemplarily, the oscillator is an RC oscillator.

Exemplarily, the second switch transistor M2 is an NMOS transistor;

the drain end of the second switch transistor M2 is connected to one end of the second resistor R2, the source end is connected to the ground, and the other end of the second resistor R2 is connected to the VN point; or the source end of the second switch transistor M2 is connected to one end of the second resistor R2, the drain end is connected to the VN point, and the other end of the second resistor R2 is connected to the ground.

Exemplarily, the switch control signal generation circuit includes one AND gate and two D triggers;

a $\bar{Q}$ end and a D end of a first D trigger and a clock input end Clk of a second D trigger are short-circuited, and a $\bar{Q}$ end and a D end of the second D trigger are short-circuited and used as an output end of the switch control signal SLEEP;

the switch control signal SLEEP and the working clock CLKOUT are used as two input phases AND of the AND gate, and an output end of the AND gate is connected to the clock input end Clk of the first D trigger.

Exemplarily, the circuit to be started up is a bias reference circuit;

the bias reference circuit includes a second PMOS transistor PM2, a third PMOS transistor PM3, a fourth PMOS transistor PM4, a zeroth NMOS transistor NM0, a first NMOS transistor NM1, and a first resistor R1;

source ends of the second PMOS transistor PM2, the third PMOS transistor PM3, and the fourth PMOS transistor PM4 are connected to the working voltage VDD;

a drain end of the third PMOS transistor PM3 is used as the voltage sampling point VR of the circuit to be started up;

a gate end of the second PMOS transistor PM2, a gate end of the third PMOS transistor PM3, a gate end of the fourth PMOS transistor PM4, and a drain end of the first NMOS transistor NM1 are connected to the voltage sampling point VR;

a gate end of the first NMOS transistor NM1, a drain end of the zeroth NMOS transistor NM0, and a drain end of the second PMOS transistor PM2 are connected to a VM point, and the VM point is used as the auxiliary startup end of the circuit to be started up;

the drain end of the first NMOS transistor NM1 and a gate end of the zeroth NMOS transistor NM0 are connected to one end of the first resistor R1;

the other end of the first resistor R1 and a source end of the zeroth NMOS transistor NM0 are connected to the ground;

a drain end of the fourth PMOS transistor PM4 is used for outputting the reference current IREF.

In the system for turning off the power consumption of the auxiliary startup circuit in this application, the auxiliary startup circuit is added with the second switch transistor M2 on the basis of the existing auxiliary startup circuit, and the gate end of the second switch transistor M2 is connected to the switch control signal SLEEP. The system can assist a circuit to be started up having a "degenerate" bias point to power on normally, and can turn off the power consumption of the auxiliary startup circuit to reduce the power consumption after the circuit to be started up is powered on.

BRIEF DESCRIPTION OF THE DRAWINGS

In order to describe the technical solution of this application more clearly, the drawings required for this application will be briefly introduced below. Apparently, the drawings in the following description are only some embodiments of this application. Those skilled in the art may obtain other drawings according to these drawings without contributing any inventive labor.

DETAILED DESCRIPTION OF THE APPLICATION

The technical solutions in the embodiments of this application will be described below clearly and completely with reference to the drawings in the embodiments of this application. Apparently, the described embodiments are only a part of the embodiments of this, not all of them. Based on the embodiments of this application, all other embodiments obtained by those skilled in the art without contributing any inventive labor still fall within the scope of protection of this application.

Words such as "first" and "second" used in this application do not indicate any order, quantity, or importance, but are only intended to distinguish different components. Words such as "comprising" or "including" refer to that a component or object that appears before the word includes components or objects listed after the word and their equivalents, without excluding other components or objects. Words such as "connecting" or "connected" are not limited to physical or mechanical connections, but may include electrical connections, whether direct or indirect. Terms such as "up", "down", "left", "right", "front" and "back" are only intended to represent relative positional relationships. When the absolute position of a described object changes, the relative positional relationship may also change correspondingly.

It should be noted that, without conflict, the embodiments of this application and the features in the embodiments may be combined with each other.

EMBODIMENT 1

Figure 1:
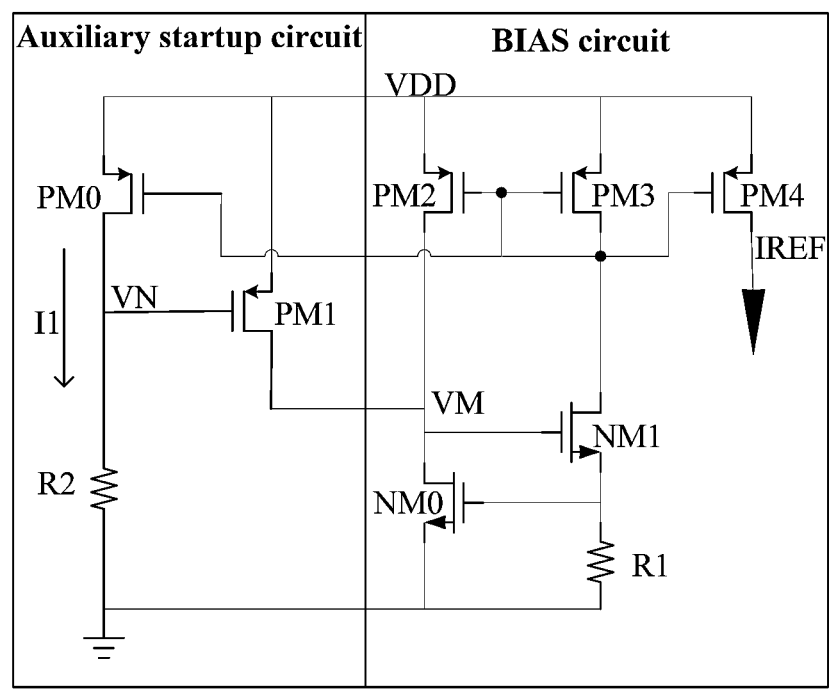
FIG. 1 illustrates an existing resistive auxiliary startup circuit.
Figure 2:
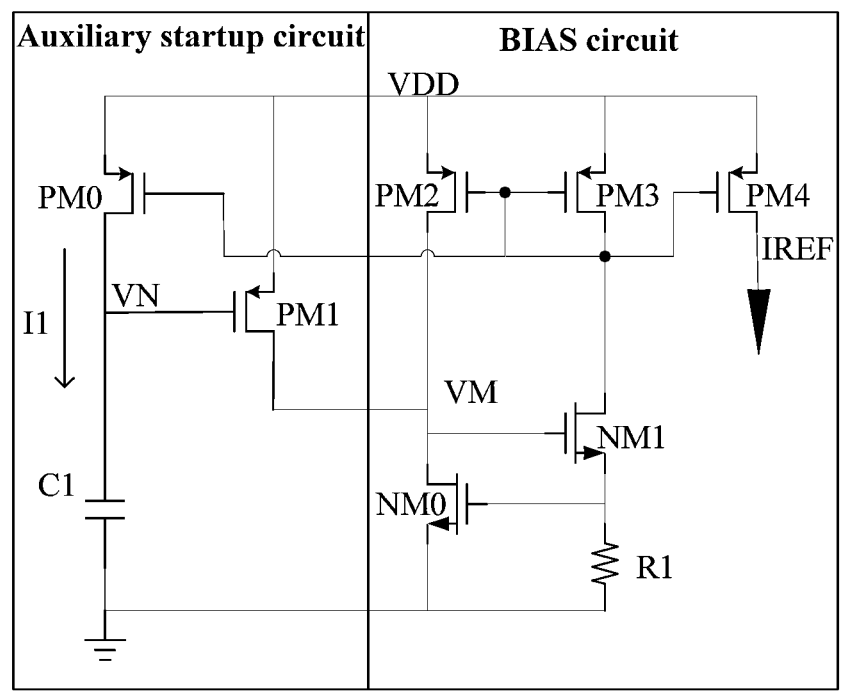
FIG. 2 illustrates an existing capacitive auxiliary startup circuit.
Figure 3:
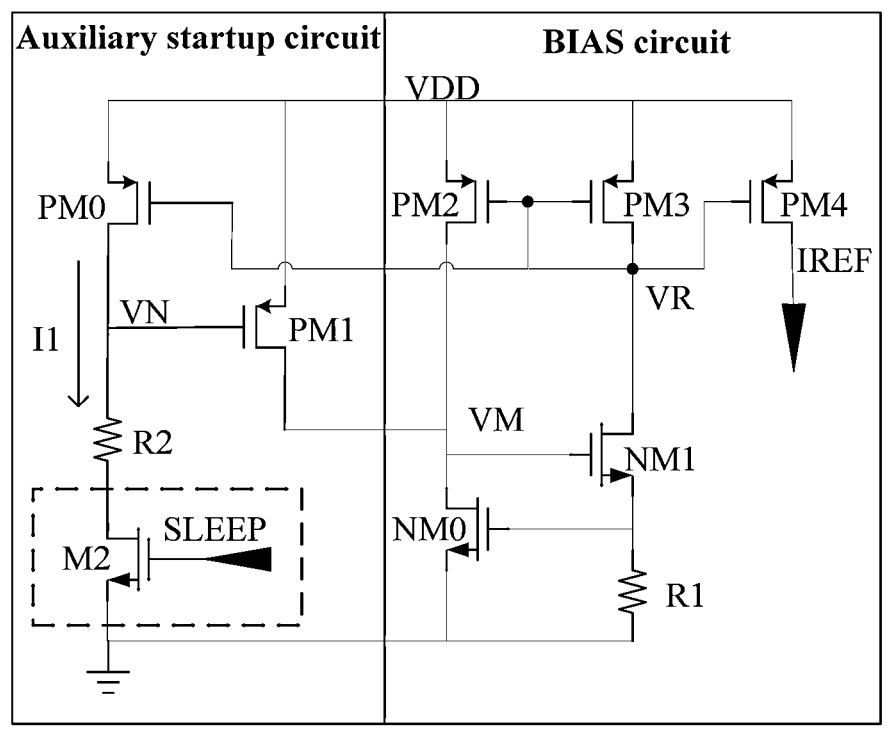
FIG. 3 illustrates a circuit diagram of a system for turning off power consumption of an auxiliary startup circuit according to an embodiment of this application.

A system for turning off power consumption of an auxiliary startup circuit is as illustrated in FIG. 1. The auxiliary startup circuit includes a zeroth PMOS transistor PM0, a first PMOS transistor PM1, a second resistor R2, and a second switch transistor M2.

Source ends of the zeroth PMOS transistor PM0 and the first PMOS transistor PM1 are connected to a working voltage VDD.

The source end of the zeroth PMOS transistor PM0 is used as a VN point.

The second resistor R2 is connected in series between the VN point and the ground.

A gate end of the first PMOS transistor PM1 is connected to the VN point, and a drain end is connected to an auxiliary startup end of a circuit to be started up.

A gate end of the zeroth PMOS transistor PM0 is connected to a voltage sampling point VR of the circuit to be started up.

When power is on and a voltage applied to the auxiliary startup end is 0.7-1 times the working voltage VDD, the circuit to be started up is capable of working normally, and a voltage at the voltage sampling point is 0.7-1 times the working voltage VDD.

A gate end of the second switch transistor M2 is connected to a switch control signal SLEEP.

One of a source end and a drain end of the second switch transistor M2 is connected to one end of the second resistor R2, the other is connected to the ground, and the other end of the second resistor R2 is connected to the VN point; or one of the source end and the drain end of the second switch transistor M2 is connected to one end of the second resistor R2, the other is connected to the VN point, and the other end of the second resistor R2 is connected to the ground.

Exemplarily, the circuit to be started up is a bias current reference circuit (BIAS), a bandgap reference circuit (BGR) or the like having a "degenerate" bias point and capable of outputting a reference current (IREF).

In the system for turning off the power consumption of the auxiliary startup circuit in embodiment 1, the auxiliary startup circuit is added with the second switch transistor M2 on the basis of the existing auxiliary startup circuit, and the gate end of the second switch transistor M2 is connected to the switch control signal SLEEP. The system can assist the circuit to be started up having a "degenerate" bias point to power on normally, and can turn off the power consumption of the auxiliary startup circuit after the circuit to be started up is powered on to reduce the power consumption.

EMBODIMENT 2

Based on the system for turning off the power consumption of the auxiliary startup circuit in embodiment 1, the auxiliary startup circuit further includes a switch control signal generation circuit.

The switch control signal generation circuit outputs the switch control signal SLEEP when the circuit to be started up works normally.

EMBODIMENT 3

Figure 5:
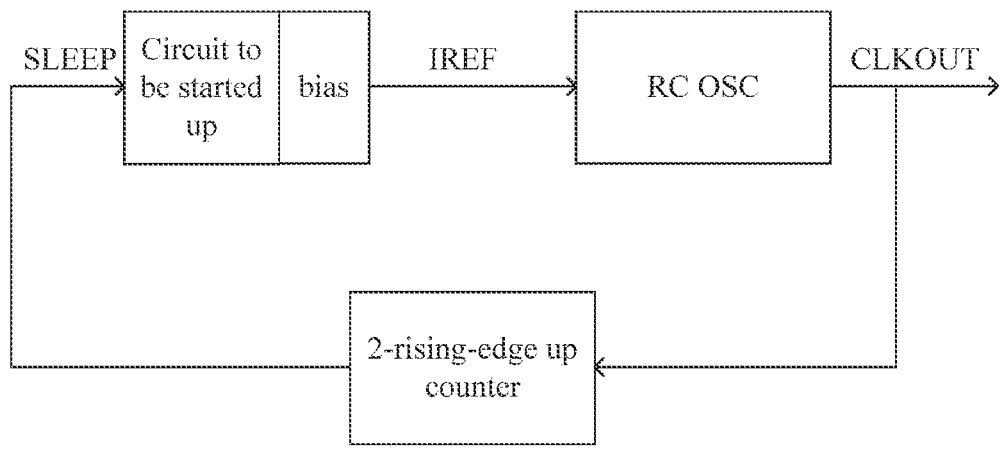
FIG. 5 illustrates an overall schematic diagram of a system for turning off power consumption of an auxiliary startup circuit according to an embodiment of this application.

Based on the system for turning off the power consumption of the auxiliary startup circuit in embodiment 2, referring to FIG. 5, the auxiliary startup circuit further includes an oscillator (OSC).

The oscillator generates a working clock CLKOUT of the switch control signal generation circuit based on the reference current IREF output by the circuit to be started up.

Exemplarily, the oscillator is an RC oscillator.

EMBODIMENT 4

Figure 4:
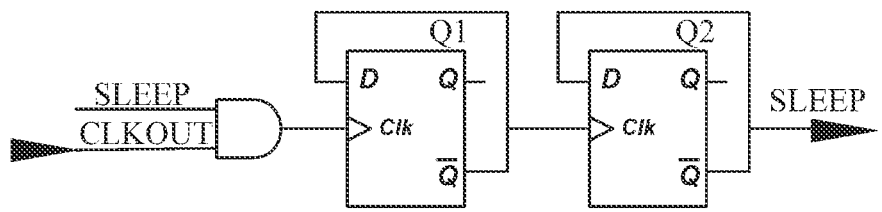
FIG. 4 illustrates a circuit diagram of a switch control signal generation circuit in a system for turning off power consumption of an auxiliary startup circuit according to an embodiment of this application.

Based on the system for turning off the power consumption of the auxiliary startup circuit in embodiment 2 or 3, referring to FIG. 4, the switch control signal generation circuit includes one AND gate and two D triggers.

A $\bar{Q}$ end and a D end of a first D trigger and a clock input end Clk of a second D trigger are short-circuited, and a $\bar{Q}$ end and a D end of the second D trigger are short-circuited and used as an output end of the switch control signal SLEEP.

The switch control signal SLEEP and the working clock CLKOUT are used as two input of the AND gate perform AND operation, and an output end of the AND gate is connected to the clock input end Clk of the first D trigger.

In the system for turning off the power consumption of the auxiliary startup circuit in embodiment 4, the switch control signal generation circuit that provides the switch control signal SLEEP is a 2-rising-edge up counter, and the $\bar{Q}$ end of the second D trigger outputs the switch control signal SLEEP, and its function states are as illustrated in Table 1, where Q1 is the Q end state of the first D trigger and Q2 is the Q end state of the second D trigger. When power is on, the initial states of Q1 and Q2 are 0, the $\bar{Q}$ end of the second D trigger in the initial state when power is on is at a high potential, the switch control signal SLEEP is set to high when power is on, so that the second switch transistor M2 is in a conducted state when power is on, and the potential at the VN point is pulled down, and the first PMOS transistor PM1 is conducted, resulting in that the voltage applied to the auxiliary startup end of the circuit to be started up is close to the working voltage VDD, the circuit to be started up can work normally, the voltage at the voltage sampling point is 0.7-1 times the working voltage VDD, and the zeroth PMOS transistor PM0 is maintained on (conducted). After the rising edges of two pulses of the working clock CLKOUT, the switch control signal SLEEP is set to low, and the second switch transistor M2 is turned off, thus eliminating the consumption of the current of the auxiliary startup circuit flowing through the second resistor R2. At the same time, the working clock CLKOUT is prohibited from entering the D trigger because the AND gate is turned off by the switch control signal SLEEP, the clock pulse of the D trigger is turned off, and the switch control signal SLEEP is continuously at a low potential. Since the zeroth PMOS transistor PM0 is in a conducted state, the potential at the VN point is pulled close to the working voltage VDD, so that the first PMOS transistor PM1 is turned off and the auxiliary startup circuit is turned off. After the circuit to be started up is successfully powered on, the auxiliary started up circuit no longer produces power consumption.

In the system for turning off the power consumption of the auxiliary startup circuit in embodiment 4, the switch control signal SLEEP is powered by following the working voltage VDD. After the circuit to be started works normally for 2 clock pulses, the switch control signal SLEEP is set to low and the auxiliary startup circuit is turned off. The control of the switch control signal SLEEP is only related to logic functions and is not related to the power-on speed.

TABLE 1

| Pulses | $Q_2^n$ | $Q_1^n$ | $Q_2^{n+1}$ | $Q_1^{n+1}$ | SLEEP |
|---|---|---|---|---|---|
| 1 | 0 | 0 | 0 | 1 | 1 |
| 2 | 0 | 1 | 1 | 0 | 0 |

EMBODIMENT 5

Based on the system for turning off the power consumption of the auxiliary startup circuit in embodiment 4, the circuit to be started up is a bias reference circuit (BIAS).

The bias reference circuit includes a second PMOS transistor PM2, a third PMOS transistor PM3, a fourth PMOS transistor PM4, a zeroth NMOS transistor NM0, a first NMOS transistor NM1, and a first resistor R1.

Source ends of the second PMOS transistor PM2, the third PMOS transistor PM3, and the fourth PMOS transistor PM4 are connected to the working voltage VDD.

A drain end of the third PMOS transistor PM3 is used as the voltage sampling point VR of the circuit to be started up.

A gate end of the second PMOS transistor PM2, a gate end of the third PMOS transistor PM3, a gate end of the fourth PMOS transistor PM4, and a drain end of the first NMOS transistor NM1 are connected to the voltage sampling point VR.

A gate end of the first NMOS transistor NM1, a drain end of the zeroth NMOS transistor NM0, and a drain end of the second PMOS transistor PM2 are connected to a VM point, and the VM point is used as the auxiliary startup end of the circuit to be started up.

The drain end of the first NMOS transistor NM1 and a gate end of the zeroth NMOS transistor NM0 are connected to one end of the first resistor R1.

The other end of the first resistor R1 and a source end of the zeroth NMOS transistor NM0 are connected to the ground.

A drain end of the fourth PMOS transistor PM4 is used for outputting the reference current IREF.

In the system for turning off the power consumption of the auxiliary startup circuit in embodiment 5, the bias reference circuit (BIAS) provides the reference current IREF to other circuit modules. The zeroth PMOS transistor PM0 is a current mirror transistor. The mirror current is provided by the bias reference circuit (BIAS). In the power-on process of the working voltage VDD, the voltage at the VN point is low, the first PMOS transistor PM1 is conducted, the voltage at the VM point is pulled up, and the bias reference circuit (BIAS) is started up normally. After startup, the current of the bias reference circuit (BIAS) mirrored by the zeroth PMOS transistor PM0 flows through the second resistor R2, raising the voltage at the VN point.

EMBODIMENT 6

Based on the system for turning off the power consumption of the auxiliary startup circuit in embodiment 1, the second switch transistor M2 is an NMOS transistor.

The drain end of the second switch transistor M2 is connected to one end of the second resistor R2, the source end is connected to the ground, and the other end of the second resistor R2 is connected to the VN point; or the source end of the second switch transistor M2 is connected to one end of the second resistor R2, the drain end is connected to the VN point, and the other end of the second resistor R2 is connected to the ground.

When the switch control signal SLEEP is at a high potential (greater than 0.7V), the second switch transistor M2 is turned on (the source end and the drain end are connected). When the switch control signal SLEEP is at a low potential (0V), the second switch transistor M2 is turned off.

What are described above are only exemplary embodiments of this application and are not intended to limit this application. Any modifications, equivalent replacements, improvements and the like made within the spirit and principle of this application should be included within the scope of protection of this application.

What is claimed is:

1. A system for turning off power consumption of an auxiliary startup circuit, the auxiliary startup circuit comprising a zeroth PMOS transistor (PMO), a first PMOS transistor (PM1), a second resistor (R2), and a second switch transistor (M2);
    source ends of the zeroth PMOS transistor (PMO) and the first PMOS transistor (PM1) being connected to a working voltage (VDD);
    a source end of the zeroth PMOS transistor (PMO) being used as a VN point;
    the second resistor (R2) being coupled in series between the VN point and a ground;
    a gate end of the first PMOS transistor (PM1) being connected to the VN point, a drain end being connected to an auxiliary startup end of a circuit to be started up;
    a gate end of the zeroth PMOS transistor (PMO) being connected to a voltage sampling point (VR) of the circuit to be started up;
    when power is on and a voltage applied to the auxiliary startup end is 0.7-1 times the working voltage (VDD), the circuit to be started up being capable of working normally, a voltage at the voltage sampling point being 0.7-1 times the working voltage (VDD);
    a gate end of the second switch transistor (M2) being connected to a switch control signal (SLEEP);
    one of a source end and a drain end of the second switch transistor (M2) being connected to one end of the second resistor (R2), the other being connected to the ground, the other end of the second resistor (R2) being connected to the VN point; or
    one of the source end and the drain end of the second switch transistor (M2) being connected to one end of the second resistor (R2), the other being connected to the VN point, the other end of the second resistor (R2) being connected to the ground;

the circuit to be started up is a circuit having a "degenerate" bias point and capable of outputting a reference current (IREF);

the auxiliary startup circuit further comprises a switch control signal generation circuit and an oscillator;

the switch control signal generation circuit outputs the switch control signal (SLEEP) when the circuit to be started up works normally; and the oscillator generates a working clock (CLKOUT) of the switch control signal generation circuit based on the reference current (IREF) output by the circuit to be started up.

2. The system for turning off the power consumption of the auxiliary startup circuit according to claim 1, wherein the circuit to be started up is a bias reference circuit or a bandgap reference circuit.

3. The system for turning off the power consumption of the auxiliary startup circuit according to claim 1, wherein the oscillator is an RC oscillator, and a reference current thereof comes from the circuit to be started up.

4. The system for turning off the power consumption of the auxiliary startup circuit according to claim 1, wherein the switch control signal generation circuit comprises one AND gate and two D triggers;

a $\bar{Q}$ end and a D end of a first D trigger and a clock input end (Clk) of a second D trigger are short-circuited, and a $\bar{Q}$ end and a D end of the second D trigger are short-circuited and used as an output end of the switch control signal (SLEEP); and the switch control signal SLEEP and the working clock CLKOUT are used as two inputs of the AND gate, and an output end of the AND gate is connected to a clock input end Clk of the first D trigger.

5. The system for turning off the power consumption of the auxiliary startup circuit according to claim 1, wherein the circuit to be started up is a bias reference circuit;

the bias reference circuit comprises a second PMOS transistor (PM2), a third PMOS transistor (PM3), a fourth PMOS transistor (PM4), a zeroth NMOS transistor (NM0), a first NMOS transistor (NM1), and a first resistor (R1);

source ends of the second PMOS transistor (PM2), the third PMOS transistor (PM3), and the fourth PMOS transistor (PM4) are connected to the working voltage (VDD);

a drain end of the third PMOS transistor (PM3) is used as the voltage sampling point (VR) of the circuit to be started up;

a gate end of the second PMOS transistor (PM2), a gate end of the third PMOS transistor (PM3), a gate end of the fourth PMOS transistor (PM4), and a drain end of the first NMOS transistor (NM1) are connected to the voltage sampling point (VR);

a gate end of the first NMOS transistor (NM1), a drain end of the zeroth NMOS transistor (NM0), and a drain end of the second PMOS transistor (PM2) are connected to a VM point, and the VM point is used as the auxiliary startup end of the circuit to be started up;

the drain end of the first NMOS transistor (NM1) and a gate end of the zeroth NMOS transistor (NM0) are connected to one end of the first resistor (R1);

the other end of the first resistor (R1) and a source end of the zeroth NMOS transistor (NM0) are connected to the ground; and a drain end of the fourth PMOS transistor (PM4) is used for outputting a reference current (IREF).

6. The system for turning off the power consumption of the auxiliary startup circuit according to claim 1, wherein the second switch transistor (M2) is an NMOS transistor;

the drain end of the second switch transistor (M2) is connected to one end of the second resistor (R2), the source end is connected to the ground, and the other end of the second resistor (R2) is connected to the VN point; or the source end of the second switch transistor (M2) is connected to one end of the second resistor (R2), the drain end is connected to the VN point, and the other end of the second resistor (R2) is connected to the ground.

* * * * *